United States Patent [19]

Connell

[11] Patent Number: 4,827,226

[45] Date of Patent: May 2, 1989

[54] FULLY INTEGRATED, ADJUSTABLE OSCILLATOR FOR USE WITH A CRYSTAL

[75] Inventor: Lawrence E. Connell, Naperville, Ill.

[73] Assignee: Motorola, Inc., Schaumburg, Ill.

[21] Appl. No.: 200,329

[22] Filed: May 31, 1988

[51] Int. Cl.$^4$ .............................................. H03B 5/36
[52] U.S. Cl. .......................... 331/116 FE; 331/108 C; 331/158; 331/177 V
[58] Field of Search ............. 331/36 C, 108 C, 116 R, 331/116 FE, 158, 159, 176, 177 V, 179, DIG. 3

[56] References Cited

U.S. PATENT DOCUMENTS

| | | | |
|---|---|---|---|
| 3,373,379 | 3/1986 | Black | 331/116 R |
| 3,729,688 | 4/1973 | Cerny, Jr. et al. | 331/1 A |
| 3,821,665 | 6/1974 | Irwin et al. | 331/116 R |
| 3,970,996 | 7/1976 | Keller et al. | 331/116 R |
| 4,378,534 | 3/1983 | Goedken et al. | 332/18 |
| 4,587,497 | 5/1986 | Keller et al. | 331/116 R |
| 4,591,807 | 5/1986 | Davis | 331/116 R |
| 4,609,884 | 9/1986 | Kindinger et al. | 331/109 |
| 4,658,223 | 4/1987 | Marvin et al. | 331/176 |
| 4,710,730 | 12/1987 | Doyle | 331/116 FE |
| 4,751,475 | 6/1988 | Kubo et al. | 331/177 V X |

OTHER PUBLICATIONS

Solid State Radio Engineering, Herbert L. Krauss, Charles W. Bostian, and Frederick H. Raab, 1980, pp. 146-159.
"A New Digital TCXO Circuit Using a Capacitor-Switch Array", I.E.E.E. reprint CH1957-0/83, pp. 434-435.
"Application of Floating MOS Variable Capacitor for the Watch IC", Y. Hattori, R. Matuszaki, K. Tanaka, A. Watanabe, Gallagher & Associates.
The Radio Amateur's Handbook, A.R.R.L., 1981, p. 8-13.
The Radio Amateur's Handbook, A.R.R.L., 1978, p. 139.
The Radio Amateur's VHF Manual, A.R.R.L., 1968, p. 99.

Primary Examiner—David Mis
Attorney, Agent, or Firm—Ronald G. Wesoloski

[57] ABSTRACT

A fully integrated, adjustable oscillator circuit for use with a crystal is disclosed in which a crystal oscillator, such as a Pierce oscillator, is arranged to utilize a tuning network that includes at least one integrated varactor (voltage-variable-capacitor) as a shunt element for providing at least one type of adjustment of the oscillating signal. More than one type of adjustment can be provided by including a bank of varactors for each of the shunt elements of the tuning network, in which various individual varactors are selected in binary (on-off) fashion to effect digital as well as analog adjustment of the crystal oscillator.

21 Claims, 1 Drawing Sheet

FULLY INTEGRATED, ADJUSTABLE OSCILLATOR FOR USE WITH A CRYSTAL

BACKGROUND OF THE INVENTION

This invention relates to the field of crystal oscillators, and specifically to an arrangement for a fully integrated, adjustable oscillator for use with a crystal, such as an AT-cut crystal.

Temperature compensated crystal oscillators are known in the art. These crystal oscillators generally fall into two categories, namely, those having analog compensation techniques and those having digital compensation techniques. However, each of these two categories of crystal oscillators has fallen short of achieving a fully integrated oscillator arrangement for use with a crystal.

In particular, present day temperature compensated crystal oscillators utilize one or more discrete hyper-abrupt junction varactors to set the target frequency ($f_o$) as well as to correct for variations due to shift in the crystal frequency versus temperature. As is well known in the art, this type of varactor has a linear capacitive reactance versus voltage characteristic and a large tuning ratio, or high voltage sensitivity. The significant drawback to utilizing such a hyper-abrupt varactor is that it cannot be integrated with the rest of the oscillator circuit.

By contrast, an abrupt junction varactor can be integrated onto the same semiconductor device die along with other integrated circuitry, but a device made in this structure suffers from very large "make" tolerance of as much as plus or minus 30%. Moreover, such an integrated abrupt junction varactor also suffers from a low tuning ratio, or voltage sensitivity, that ultimately limits its ability to correct for its own varactor make tolerance as well as for any fixed capacitor make tolerances and supply tolerances, and still provide enough reserve tuning for temperature compensation or aging compensation. Even though the reactance of an integrated varactor is nonlinear versus voltage, this characteristic can be compensated by utilizing an appropriate circuit.

Another problem resulting from attempting to utilize an integrated abrupt junction varactor is that very large variations in RF level can occur due to poor make tolerances. Very high RF levels limit the varactor voltage tuning range since the RF peaks must be kept from forward biasing the varactor diode junction. Very low RF levels can cause oscillations to stop as the temperature varies.

SUMMARY OF THE INVENTION

Accordingly, it is an object of the present invention to provide a fully integrated, yet continuously adjustable oscillator for use with a crystal that overcomes the foregoing deficiencies.

It is another object of the present invention to provide a fully integrated, digitally adjustable oscillator of the foregoing type that provides at least one type of adjustment of the oscillating signal outputted by the oscillator circuit.

Briefly described, the present invention contemplates a crystal oscillator circuit arrangement, such as a Pierce oscillator, that utilizes a tuning network which includes at least one integrated varactor (voltage-variable capacitor) as a shunt element for providing at least one type of adjustment of the oscillating signal. More than one type of adjustment can be provided by including a bank of varactors for each of the shunt elements of the tuning network, in which various individual varactors are selected in binary (on-off) fashion to effect digital as well as analog adjustment of the crystal oscillator.

DETAILED DESCRIPTION OF THE PREFERRED EMBODIMENT

Figures 1, 2:
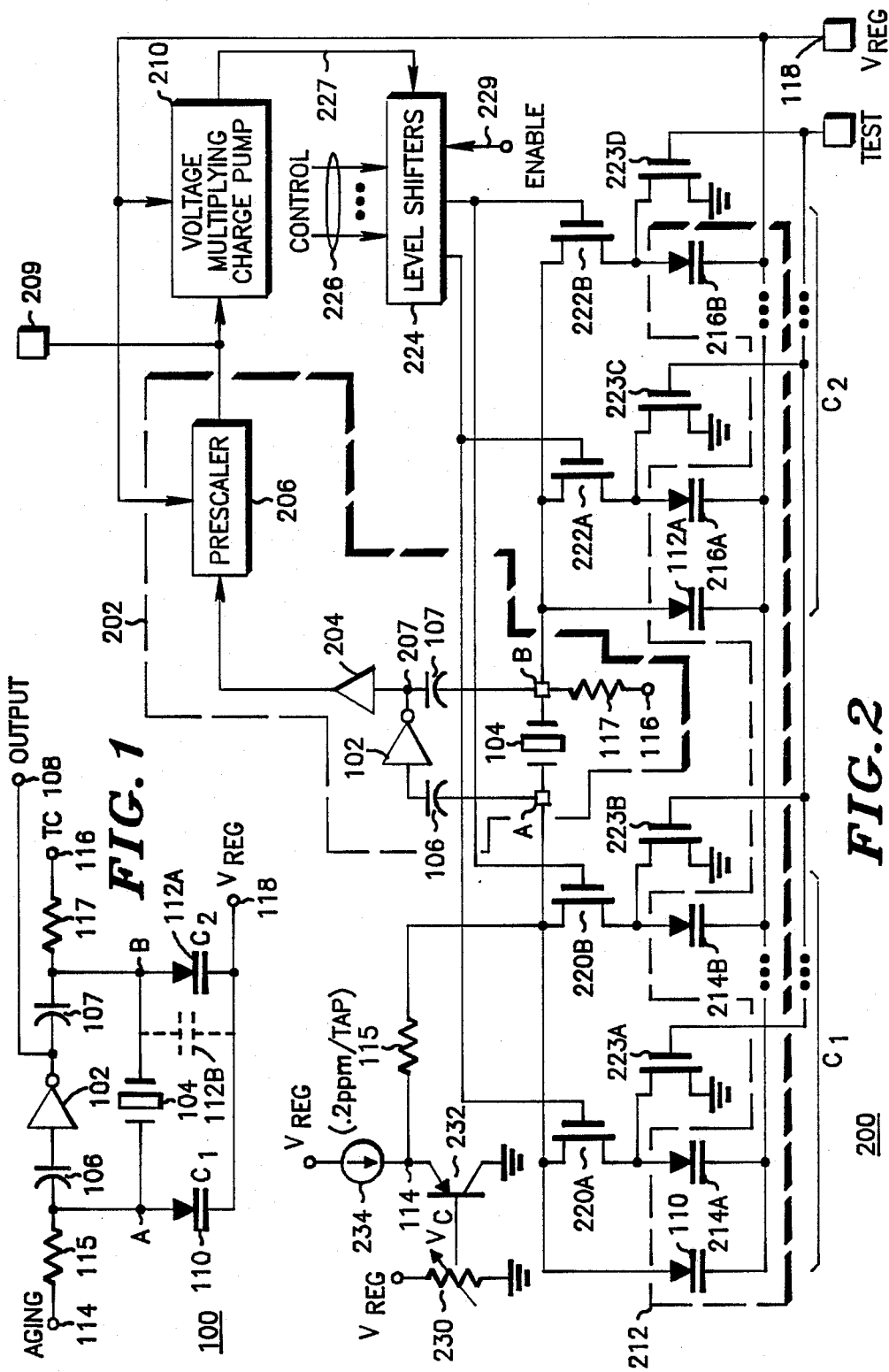
FIG. 1 is a block diagram of the simplest form of the present invention.
FIG. 2 is a more detailed block diagram depicting further aspects of the present invention.

Referring now to FIG. 1, a block diagram of the simplest form of the present invention is shown at 100 in which a fully integrated oscillator is formed by coupling an inverting amplifier (102) to an external crystal (104) via two blocking capacitors (106,107) to provide an oscillating signal at an output port (108). In the preferred embodiment, the crystal (104) utilized is an AT-cut crystal, but it is contemplated that other types of crystals can also be utilized.

In addition, at least one integrated varactor (110) is constructed and arranged to couple to the oscillator arrangement. A second shunt capacitor is also employed which may be either an integrated varactor (112A) or a fixed integrated capacitance (112B, as shown in dotted lines). As will be seen in a moment, the preferred embodiment contemplates the use of two varactors, but for less stringent tuning requirements, one of the two shunt elements can be a capacitor of fixed value having a moderate tolerance of plus or minus 10%, rather than a varactor. Thus, the crystal and each of the two shunt elements C1 (110) and C2 (112) form a tuning network around the inverting stage of the oscillator. When the oscillator is on frequency, the value of C1=C2=twice the crystal load capacitance.

Although depicted as a Pierce crystal oscillator in which the crystal operates with a positive value of reactance as an inductor, a Colpitts crystal oscillator configuration can also be utilized.

A control circuit (not shown) can be coupled to the oscillator and can be integrated as part of the oscillator arrangement and utilized for controlling one or more of the integrated varactors. One way to effect a tuning adjustment is by way of terminal #1 (114), which couples to C1 via resistor (115). Another way to effect a tuning adjustment is via terminal #2 (116), which couples to C2 via resistor (117). Therefore, in this arrangement, the control circuit is simplified in that it need only control the individual varactors independently of each other, by utilizing only one type of adjustment, namely, controlling an analog (or DC) voltage. However, this topology offers special advantages that will become apparent when considering the next figure.

Turning now to FIG. 2, a more detailed block diagram is shown at 200 in which an amplifier is coupled to a crystal as a Pierce oscillator that includes a tuning network that offers two types of adjustments of the integrated oscillator arrangement.

In this embodiment, a fully integrated oscillator (202) is formed by coupling an inverting amplifier (102) to an external crystal (104) via two blocking capacitors (106,107), as well as to an included buffer stage (204) followed by a prescaler (206). The prescaler (206) divides the oscillating signal at node (207) by an integer number to provide a lower frequency output signal at the output (209). The prescaler output also drives the voltage multiplying charge pump (or DC to DC converter) (210). The purpose of the voltage multiplying charge pump (210) will be described later in conjunction with the rest of the control circuit integrated on the same chip as part of the oscillator arrangement.

Note also that the oscillator (202) includes a tuning network that couples to the external crystal (104). This tuning network includes a bank of varactors, labelled C1 and C2, respectively, portions of which are selectively connected in parallel as shunt elements on either side of the crystal (104). In this embodiment, C1 and C2 each include at least one integrated varactor (110, 112A) coupled directly from one side of the crystal to the regulated voltage source line (118), which is also an RF (or AC) ground for the varactors, similar to the earlier FIG. 1 embodiment.

However, the arrangement in FIG. 2 also includes additional varactors that may be coupled into the circuit utilizing a second type of adjustment, namely digital selection. This topology makes effective use of the structure that results when integrating abrupt junction varactors as part of the overall integrated circuit. That is, in order to realize a switched capacitance in an N-well CMOS (complimentary metal oxide semiconductor) process, it is necessary that the switch be placed between the crystal and the varactor diode. If it were not so placed, the varactor would not be effectively removed when the switch is open since an excessive process inherent parasitic capacitance would still exist between the varactor diode cathode and the substrate.

Similarly, the switch characteristics need to be considered. Each switch (220A through 220B, and 222A through 222B) is an N-channel device and should be made relatively "small" to minimize its own parasitic capacitances so as to not desensitize the varactors and yet still have low "on" impedance to minimize RF signal losses (generally described in terms of Q, which is a measure of the energy stored divided by the energy dissipated per cycle of signal) in the circuit. However, their circuit location and desired characteristics require that a relatively high control voltage be used for effective control. This is accomplished by utilizing a voltage multiplying charge pump (210), since the rest of the oscillator circuit is configured to consume low power and only requires a supply voltage of about 4 volts. Typically, the varactor segment varies from 4 pF at zero bias to about 1.6 pF at 4 V bias, and the switch stray capacitance is on the order of 0.05 pF (off) to 0.12 pF (on).

As a result, the effective value of varactance in the tuning network (212) can be changed in equal steps, or increments, on each side of the crystal (104) by selectively activating one or more switch pairs (220A and 222A, etc.) Switches (223A-223D) are also N-channel devices and are utilized in the preferred embodiment for test purposes only.

In this way digital selection or parallel connection of one or more of the varactors allows the effective reactance on each side of the crystal (104) to be changed in equal increments, hereinafter known as ganged tuning. Gang tuning the varactors in equal increments via digital adjustment is a key feature of the present invention because it permits the varactors to have a centered DC analog control voltage that keeps them operating at the same RF level to avoid clipping. This digital ganged tuning is effective for initially adjusting the circuit to set the absolute value of the varactors to effectively overcome the varactor make tolerance by switching in different amounts of varactance until the oscillator is on frequency.

One will know that the oscillator is on frequency by observing that the value for each of C1 and C2 will equal twice the crystal load capacitance within the crystal make tolerance. Thus, for a typical error of plus or minus 0.5 picofarads, a 20 picofarad crystal exhibits a crystal make tolerance of plus or minus 2.5%. As a result, the absolute uncertainty of varactor capacitance is reduced from a typical plus or minus 30% make tolerance down to plus or minus 2.5%, and no loss of tuning range has been incurred.

A second type of tuning can be utilized once this is accomplished. This second type of tuning is analog tuning by means of adjusting the DC voltage level applied to terminal A or terminal B of the crystal, as shown. These terminals are coupled to the varactors, which are effective in providing aging compensation or automatic frequency control (AFC) at terminal A and temperature compensation (T.C.) at terminal B, respectively, in the circuit topology of FIG. 2. An on-chip circuit for providing an aging analog control or AFC signal includes a programmable voltage tap (230) that drives an on-chip diode consisting of transistor (232) fed from a current source (234) to provide an approximate incremental change of 0.2 ppm in frequency per tap change. When the analog control signal is used to bias an integrated varactance whose temperature characteristics are typically bias dependent, a bias set in the form of a programmable voltage tap needs to be modified by the temperature characteristics of a diode in order to render an integrated varactor's temperature characteristics independent of the voltage tap selection. In this way, the oscillator temperature compensation, which is performed in the factory at the time of manufacture and compensates for the temperature variation of all components in the oscillator circuit (including the aging adjust varactor), will not be compromised when the oscillator is later adjusted for aging.

In order to provide for a linear change in frequency per tap change when using an integrated varactor whose reactance varies nonlinearly with voltage, the tap voltage values, which are applied through transistor (223) to node (114) and via resistor (115) to terminal A, must be chosen appropriately. Node 116 couples to terminal B via resistor (117) for T.C. control. Given the known characteristics of an integrated abrupt junction varactor, the present embodiment exhibits effective temperature compensation when the aging adjustment is performed at terminal A of crystal 104.

The integrated control circuit is made up of at least the bank of electronic switches (220A through 220B, and 222A through 222B), and the level shifters (224) utilized to control one or more switch pairs (220A and 222A, etc.). Typically, the control signals (226) applied to the level shifters take the form of a logical signal that ranges between 0 and 5 volts DC. However, because the present invention contemplates utilizing integrated CMOS devices which occupy a small area and which exhibit a low series "on" impedance, as well as the chosen circuit topology, each of the electronic switches requires a relatively high control voltage in the range of about 13.5 volts via line 227. This high control voltage is necessary to achieve a low "on" resistance in a small switch device which is not coupled directly to ground, but which has an intervening circuit element between it and RF ground.

The level shifters (224) may be configured like a readily available level shifter, such as an MC-14504 available from Motorola. They should rely on an inputted enable signal via line 229 that holds all of the switches (220, 222) "off" during initial oscillator power-up, to ensure successful starting of the oscillator. Otherwise, if the switches were allowed to be "on" during power-up, they could be quite resistive, since the charge pump will not have reached its high value of operating voltage until sometime after the oscillator has started. Hence, the Q of the circuit would be degraded, thereby preventing the oscillator from starting.

Another consideration in the design of the level shifters (224) is that they draw minimal current at the time when they change state and are turned "on" so that a minimum amount of voltage droop occurs on the output of the voltage multiplying charge pump (210).

The voltage multiplying charge pump, as contemplated, should be powered from a regulated voltage source (via line 213) and clocked from a stable frequency, preferably at the same frequency as the output of the oscillator itself, or a derivative thereof, no less than the reference output frequency.

In this embodiment, the charge pump (210) is clocked at the reference output frequency provided by the output (209) of the prescaler (20). The charge pump (210) is configured from a plurality of on-chip diode-connected devices (or other arrangement of integrated devices to achieve a near-ideal diode switching characteristic) and capacitors to achieve a step-up in voltage from approximately 4 volts (supplied via line 118) to about 13.5 volts, via line 227. By so doing, the charge pump (210) is clocked by the prescaler (206) at a lower frequency than the crystal fundamental frequency, so that current consumption is reduced, and so that subharmonic contamination of the output (209) is prevented.

In summary, a fully integrated, adjustable oscillator for use with a crystal has been described that provides at least one type of tuning for a crystal oscillator while operating from a low supply voltage and with low current drain. In this way, a temperature compensated crystal oscillator can be implemented in fully integrated form. Accordingly, other uses and modifications will be obvious to one skilled in the art without departing from the scope of the present invention.

I claim:

1. Apparatus for a fully integrated, adjustable oscillator for use with a crystal, the apparatus comprising:
    oscillating means constructed and arranged to be coupled to said crystal for providing an oscillating signal;
    integrated variable capacitance means, coupled to said oscillating means, for providing at least one integrated variable capacitance; and
    integrated controlling means, coupled to said oscillating means and said integrated variable capacitance means, for controlling at least some of said integrated variable capacitance means,
    said adjustable oscillator being fully integrated and providing at least one type of adjustment of said oscillating signal.

2. The apparatus according to claim 1, wherein said oscillating means comprises a Pierce oscillator circuit and a tuning network that includes at least one varactor as a shunt element.

3. The apparatus according to claim 1, wherein said oscillating means comprises a Colpitts oscillator circuit and a tuning network that includes at least one varactor as a shunt element.

4. The apparatus according to claim 1, wherein said oscillating means includes an inverting amplifier.

5. The apparatus according to claim 4, wherein said oscillating means further includes a buffer and a prescaler, said prescaler for dividing said oscillating signal by an integer factor to a lower frequency.

6. The apparatus according to claim 1, wherein said integrated variable capacitance means includes at least a first and a second integrated variable capacitance.

7. The apparatus according to claim 1, wherein said integrated variable capacitance means comprises an integrated abrupt junction varactor diode.

8. The apparatus according to claim 1, wherein said integrated controlling means includes at least one switching means, configured to have minimal stray capacitance and to have low on-resistance, that is coupled to said integrated variable capacitance means.

9. The apparatus according to claim 8, wherein said integrated controlling means further includes:
    voltage generating means for providing a relatively high control voltage for said controlling means; and
    level shifting means for shifting a first control signal inputted thereto to a second level so as to control said at least one switching means.

10. The apparatus according to claim 9, wherein said voltage generating means comprises a voltage multiplying charge pump that includes a clock input coupled to said oscillating means and an output coupled to said level shifting means.

11. A fully-integrated, adjustable oscillator circuit for use with a crystal, comprising:
    an oscillator, coupled to said crystal, for providing an oscillating signal at an output port thereof;
    at least one integrated varactor coupled to said oscillator; and
    an integrated control circuit, coupled to said oscillator and said integrated varactor, for controlling a variable capacitance associated with said integrated varactor.

12. The oscillator circuit according to claim 11, wherein said oscillator comprises a Pierce crystal oscillator that includes a tuning network that includes at least one varactor as a shunt element.

13. The oscillator circuit according to claim 11, wherein said oscillator includes an inverting amplifier.

14. The oscillator circuit according to claim 13, wherein said oscillator further includes a buffer and a prescaler, said prescaler for dividing said oscillating signal by an integer factor to a lower frequency.

15. The oscillator circuit according to claim 11, wherein said oscillator comprises a Colpitts crystal oscillator that includes a tuning network that includes at least one varactor as a shunt element.

16. The oscillator circuit according to claim 11, wherein said integrated varactor includes at least one integrated, abrupt junction varactor.

17. The oscillator circuit according to claim 11, wherein said integrated control circuit includes a voltage multiplying charge pump that includes a clock input coupled to said oscillator and an output coupled to said integrated control circuit.

18. The oscillator circuit according to claim 17, wherein said voltage multiplying charge pump is clocked from said oscillator in order to prevent subharmonic contamination of the output of said oscillator output port.

19. The oscillator circuit according to claim 11, wherein said integrated control circuit includes at least one level-shifter, constructed and arranged to level shift a control signal between about 0-5 volts to another control signal between about 0-1.5 volts.

20. The oscillator circuit according to claim 11, wherein said integrated control circuit includes at least one electronic switch coupled in series with said at least one integrated varactor.

21. A fully integrated, adjustable oscillator circuit for use with a crystal, comprising:

an oscillator that includes an amplifier coupled to said crystal at a first and a second port, for providing an oscillating signal;

at least a first and a second integrated varactor coupled to said oscillator at said first and said second port, respectively;

an integrated control circuit that includes at least a first switch coupled in series with said first integrated varactor, and a second switch coupled in series with said second integrated varactor, said integrated control circuit permitting ganged tuning of said oscillator circuit via digital selection, and also permitting independent analog control of said first integrated varactor separate from said second integrated varactor.

* * * * *

UNITED STATES PATENT AND TRADEMARK OFFICE
CERTIFICATE OF CORRECTION

PATENT NO. : 4,827,226

DATED : May 2, 1989

INVENTOR(S) : Lawrence E. Connell

It is certified that error appears in the above-identified patent and that said Letters Patent is hereby corrected as shown below:

Col. 7, line 8, "0-1.5" should be --0-13.5--.

Signed and Sealed this

Twentieth Day of February, 1990

*Attest:*

JEFFREY M. SAMUELS

*Attesting Officer*   *Acting Commissioner of Patents and Trademarks*

(12) EX PARTE REEXAMINATION CERTIFICATE (7711th)
United States Patent
Connell

(10) Number: US 4,827,226 C1
(45) Certificate Issued: Sep. 7, 2010

(54) FULLY INTEGRATED, ADJUSTABLE OSCILLATOR FOR USE WITH A CRYSTAL

(75) Inventor: Lawrence E. Connell, Naperville, IL (US)

(73) Assignee: CTS Corporation, Elkhart, IN (US)

Reexamination Request:
No. 90/010,687, Oct. 13, 2009

Reexamination Certificate for:
Patent No.: 4,827,226
Issued: May 2, 1989
Appl. No.: 07/200,329
Filed: May 31, 1988

Certificate of Correction issued Feb. 20, 1990.

(51) Int. Cl.
*H03B 5/36* (2006.01)

(52) U.S. Cl. .............................. 331/116 FE; 331/108 C; 331/158; 331/177 V
(58) Field of Classification Search .................. None
See application file for complete search history.

(56) References Cited

U.S. PATENT DOCUMENTS

| | | | |
|---|---|---|---|
| 3,974,460 A | 8/1976 | Hongu et al. | 332/31 T |
| 3,982,210 A | 9/1976 | Gehrke | 331/109 |
| 4,154,989 A | 5/1979 | Pipitone | 179/84 R |
| 4,470,024 A | 9/1984 | Leuenberger | 331/108 D |
| 4,853,655 A | 8/1989 | Embree et al. | 331/116 |

OTHER PUBLICATIONS

"Variable–Frequency Oscillators" by German Gutierrez, Wiley Encyclopedia of Electrical and Electronics Engineering, copyright 1999 by John Wiley and Sons, article online posting date Dec. 27, 1999.*
"Colpitts Oscillator", Wikipedia Dec. 4, 2009 http://en.wikipedia.org/wiki/Colpitts.*
"Pierce Oscillator", Wikipedia Dec. 4, 2009 http://en.wikipedia.org/wiki/Pierce.*
"Inroduction to Quartz Frequency Standards—Oscillator Circuit Types" IEEE Ultrasonics, Ferroelectrics and Frequency Control Society, http://www.ieee–uffc.org/frequencycontrol/teaching.asp?vig=vigtypes.*
"Solid State Radio Engineering," Krause, H. L., et al., John Wiley & Sons, 1980, pp. 158–160 and 484–486.
"Voltage Controlled Oscillator Uses Ceramic Resonators," Helfrick, Albert D., Ham Radio, Jun. 1985, pp. 18–24.

* cited by examiner

*Primary Examiner*—Margaret Rubin

(57) ABSTRACT

A fully integrated, adjustable oscillator circuit for use with a crystal is disclosed in which a crystal oscillator, such as a Pierce oscillator, is arranged to utilize a tuning network that includes at least one integrated varactor (voltage-variable-capacitor) as a shunt element for providing at least one type of adjustment of the oscillating signal. More than one type of adjustment can be provided by including a bank of varactors for each of the shunt elements of the tuning network, in which various individual varactors are selected in binary (on-off) fashion to effect digital as well as analog adjustment of the crystal oscillator.

At the time of issuance and publication of this certificate, the patent remains subject to pending reexamination control number 90/008,841 filed Nov. 19, 2007. The claim content of the patent may be subsequently revised in the reexamination proceeding

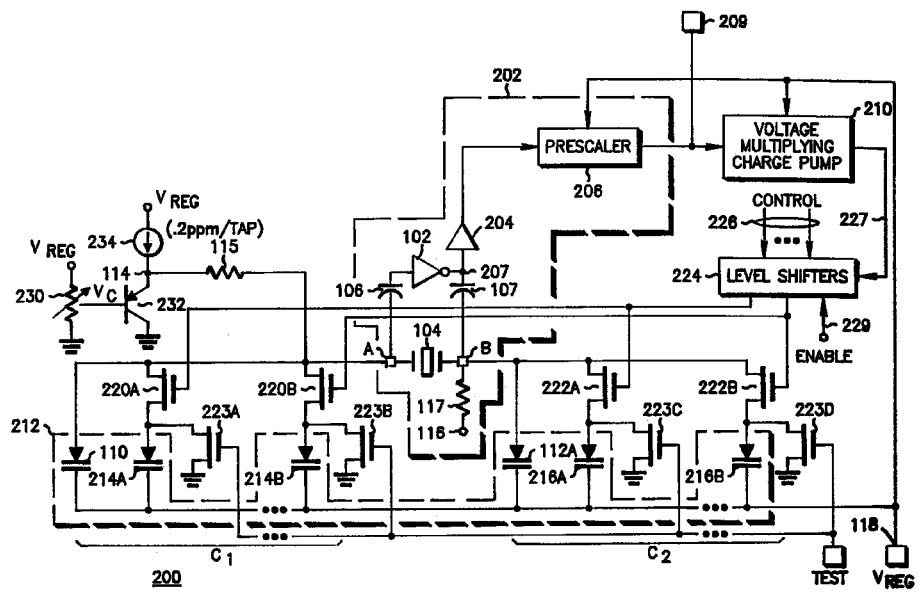

EX PARTE REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 3 and 15 is confirmed.

Claims 1, 2, 4-14 and 16-21 were not reexamined.

* * * * *

(12) EX PARTE REEXAMINATION CERTIFICATE (8818th)
United States Patent
Connell

(10) Number: US 4,827,226 C2
(45) Certificate Issued: Jan. 17, 2012

(54) FULLY INTEGRATED, ADJUSTABLE OSCILLATOR FOR USE WITH A CRYSTAL

(75) Inventor: Lawrence E. Connell, Naperville, IL (US)

(73) Assignee: CTS Corporation, Elkhart, IN (US)

Reexamination Request:
No. 90/008,841, Nov. 19, 2007

Reexamination Certificate for:
Patent No.: 4,827,226
Issued: May 2, 1989
Appl. No.: 07/200,329
Filed: May 31, 1988

Reexamination Certificate C1 4,827,226 issued Sep. 7, 2010

(51) Int. Cl.
*H03B 5/36* (2006.01)
*H03B 1/00* (2006.01)

(52) U.S. Cl. .............................. 331/116 FE; 331/108 C; 331/158; 331/177 V
(58) Field of Classification Search .................. None
See application file for complete search history.

(56) References Cited

To view the complete listing of prior art documents cited during the proceeding for Reexamination Control Number 90/008,841, please refer to the USPTO's public Patent Application Information Retrieval (PAIR) system under the Display References tab.

*Primary Examiner* — Margaret Rubin

(57) ABSTRACT

A fully integrated, adjustable oscillator circuit for use with a crystal is disclosed in which a crystal oscillator, such as a Pierce oscillator, is arranged to utilize a tuning network that includes at least one integrated varactor (voltage-variable-capacitor) as a shunt element for providing at least one type of adjustment of the oscillating signal. More than one type of adjustment can be provided by including a bank of varactors for each of the shunt elements of the tuning network, in which various individual varactors are selected in binary (on-off) fashion to effect digital as well as analog adjustment of the crystal oscillator.

At the time of issuance and publication of this certificate, the patent remains subject to pending reexamination control number 90/011,961 filed Nov. 1, 2011. The claim content of the patent may be subsequently revised if a reexamination certificate issues from the reexamination proceeding.

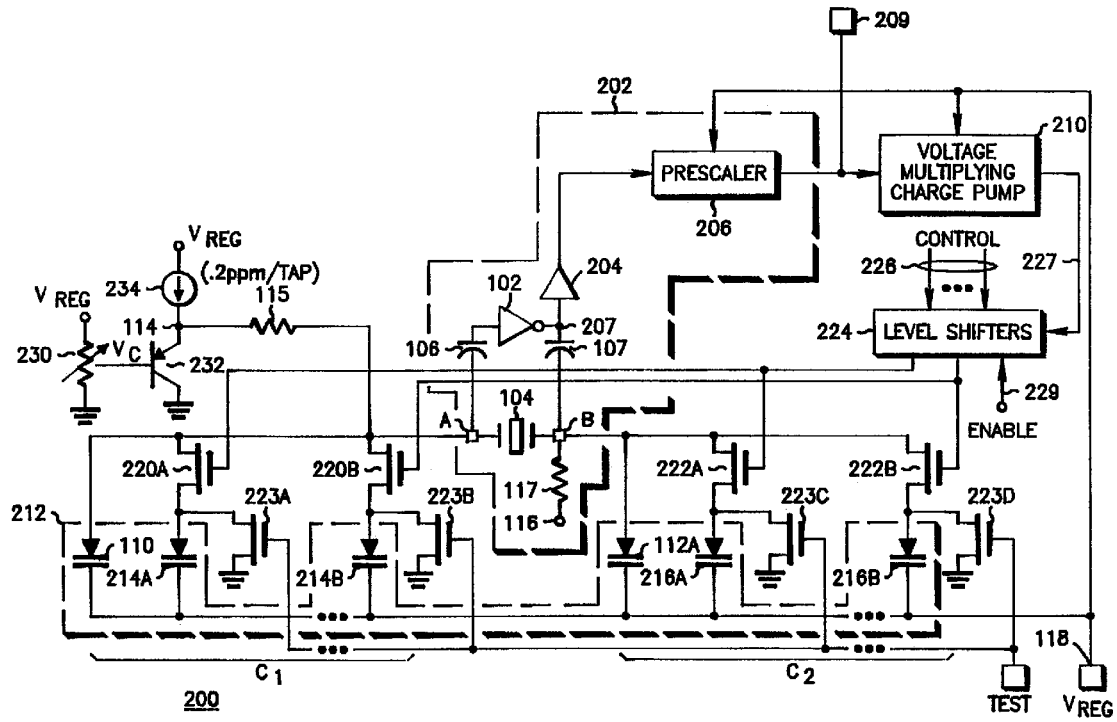

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

The patentability of claims 3, 5, 9, 10, 14, 15 and 17-21 is confirmed.

Claims 1, 2, 4, 6-8, 11-13 and 16 are cancelled.

\* \* \* \* \*

(12) EX PARTE REEXAMINATION CERTIFICATE (8916th)
United States Patent
Connell

(10) Number: US 4,827,226 C3
(45) Certificate Issued: Mar. 20, 2012

(54) FULLY INTEGRATED, ADJUSTABLE OSCILLATOR FOR USE WITH A CRYSTAL

(75) Inventor: Lawrence E. Connell, Naperville, IL (US)

(73) Assignee: CTS Corporation, Elkhart, IN (US)

Reexamination Request:
No. 90/011,961, Nov. 1, 2011

Reexamination Certificate for:
Patent No.: 4,827,226
Issued: Jan. 17, 2012
Appl. No.: 07/200,329
Filed: May 31, 1988

Reexamination Certificate C1 4,827,226 issued Sep. 7, 2010

Reexamination Certificate C2 4,827,226 issued Jan. 17, 2012

Certificate of Correction issued Feb. 20, 1990.

(51) Int. Cl.
*H03B 5/36* (2006.01)
*H03B 1/00* (2006.01)

(52) U.S. Cl. ............................ 331/116 FE; 331/108 C; 331/158; 331/177 V

(58) Field of Classification Search ...................... None
See application file for complete search history.

(56) References Cited

To view the complete listing of prior art documents cited during the proceeding for Reexamination Control Number 90/011,961, please refer to the USPTO's public Patent Application Information Retrieval (PAIR) system under the Display References tab.

*Primary Examiner* — Margaret Rubin

(57) ABSTRACT

A fully integrated, adjustable oscillator circuit for use with a crystal is disclosed in which a crystal oscillator, such as a Pierce oscillator, is arranged to utilize a tuning network that includes at least one integrated varactor (voltage-variable-capacitor) as a shunt element for providing at least one type of adjustment of the oscillating signal. More than one type of adjustment can be provided by including a bank of varactors for each of the shunt elements of the tuning network, in which various individual varactors are selected in binary (on-off) fashion to effect digital as well as analog adjustment of the crystal oscillator.

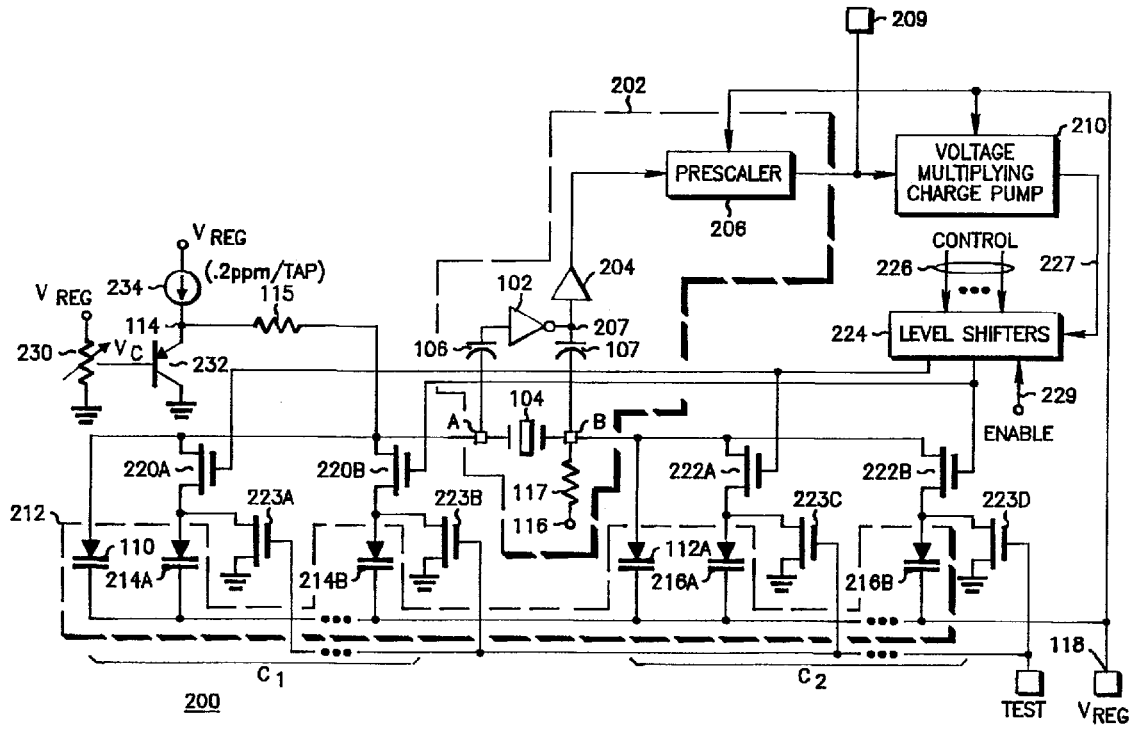

EX PARTE REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 3 and 15 is confirmed.

Claims 1, 2, 4, 6-8, 11-13 and 16 were previously cancelled.

Claims 5, 9, 10, 14 and 17-21 were not reexamined.

* * * * *